(12) United States Patent
Krempel-Hesse et al.

(10) Patent No.: US 7,959,776 B2
(45) Date of Patent: Jun. 14, 2011

(54) COOLED BACKING PLATE FOR A SPUTTERING TARGET, AND SPUTTERING TARGET COMPRISING A PLURALITY OF BACKING PLATES

(75) Inventors: Jörg Krempel-Hesse, Eckartsborn (DE); Andreas Jischke, Kahl (DE); Uwe Schüßler, Aschaffenburg (DE); Hans Wolf, Erlensee (DE)

(73) Assignee: Applied Films GmbH & Co., Alzenau (DE)

( * ) Notice: Subject to any disclaimer, the term of this patent is extended or adjusted under 35 U.S.C. 154(b) by 0 days.

(21) Appl. No.: 12/323,287

(22) Filed: Nov. 25, 2008

(65) Prior Publication Data
US 2009/0134019 A1    May 28, 2009

Related U.S. Application Data

(62) Division of application No. 11/068,538, filed on Feb. 28, 2005.

(30) Foreign Application Priority Data

Nov. 19, 2004    (EP) .................................... 04027573

(51) Int. Cl.
*C23C 14/34*    (2006.01)
(52) U.S. Cl. .............................. 204/298.09; 204/298.07
(58) Field of Classification Search ............. 204/298.07, 204/298.09
See application file for complete search history.

(56) References Cited

U.S. PATENT DOCUMENTS

| | | | |
|---|---|---|---|
| 5,096,536 A * | 3/1992 | Cathey, Jr. .................... | 438/715 |
| 5,096,562 A * | 3/1992 | Boozenny et al. ....... | 204/298.22 |
| 5,433,835 A | 7/1995 | Demaray et al. | |
| 5,487,822 A * | 1/1996 | Demaray et al. ......... | 204/298.09 |
| 5,873,989 A | 2/1999 | Hughes et al. | |
| 6,113,754 A | 9/2000 | Oh et al. | |
| 6,199,259 B1 | 3/2001 | Demaray et al. | |
| 6,340,415 B1 | 1/2002 | Raaijmakers et al. | |
| 6,494,999 B1 | 12/2002 | Herrera et al. | |
| 2002/0100680 A1 | 8/2002 | Yamamoto et al. | |

FOREIGN PATENT DOCUMENTS

| | | |
|---|---|---|
| DE | 19916938 | 10/2000 |
| DE | 10058769 | 8/2002 |
| EP | 1659193 A1 | 11/2004 |
| FR | 2573441 | 5/1986 |
| JP | 60110873 | 6/1985 |
| JP | 62077461 | 4/1987 |
| JP | 3140464 A | 6/1991 |
| JP | 5132774 A | 5/1993 |

* cited by examiner

*Primary Examiner* — Nam X Nguyen
*Assistant Examiner* — Jason M Berman
(74) *Attorney, Agent, or Firm* — Ballard Spahr LLP

(57) ABSTRACT

Claimed is a sputtering target system comprising a plurality of backing plates to be individually cooled. Each backing plate is provided on its back side with a meandering groove that is closed off by a sealing plate. The sealing plate is welded around its circumference to the backing plate and at the same time is welded to at least one ridge located at a distance from the frame, which separates two grooved sections from one another. The sealing plate thus welded to the backing plate not only closes off the grooves to form a cooling channel, but also is used for reinforcement of the otherwise relatively flat backing plate.

1 Claim, 3 Drawing Sheets

COOLED BACKING PLATE FOR A SPUTTERING TARGET, AND SPUTTERING TARGET COMPRISING A PLURALITY OF BACKING PLATES

This application is a divisional application of copending U.S. patent application Ser. No. 11/068,538, filed Feb. 25, 2005, which claims priority to and the benefit of European Patent Application No. 04027573.7 filed Nov. 19, 2004, which applications are incorporated in their entirety in this document by reference.

BACKGROUND OF THE INVENTION

Field of The Invention

The invention relates to a cooled backing plate for a sputtering target, on the front side of which the material to be sputtered may be applied, and on the back side of which means for cooling the backing plate are present.

Such a backing plate is described in U.S. Pat. No. 6,494,999 B1. According to the cited document the backing plate has a two-part design. A first plate is used as a holder for the material to be sputtered, which is applied there in the form of tiles. A second plate mounted below this first plate is provided with cooling channels which allow the heat produced at the first plate during operation to be dissipated.

As a result of the two-part design, the backing plate comprising the two individual plates has a certain thickness, which is disadvantageous in that the field lines from a magnet assembly, usually situated behind the backing plate, must pass through the backing plate in order to form a magnetic field in front of the front side, which serves to increase the sputtering rate.

Systems are also known in which the cooling plate is mounted on a supporting plate inserted into the opening in a vacuum chamber, the magnet assembly being situated outside the vacuum chamber. Thus, the field lines must penetrate not only the backing plate, but the supporting plate as well. It is therefore critical that the backing plate in particular is not too thick, so that an adequate magnetic field can be formed in front of the backing plate, even for magnets that are not particularly strong. On the other hand, the backing plate must not be too thin, since it is used as a holder for the material to be sputtered, which generally is applied in the form of tiles on the front side. The plate therefore must have sufficient rigidity. This is particularly true when the backing plate does not lie with its entire surface on the supporting plate, but instead lies only with its edges on support ridges and is intended to span the space therebetween in a self-supporting manner.

The object of the invention, therefore, is to provide a cooled backing plate which is as thin as possible but which also has sufficient rigidity.

To achieve this object, the invention provides that in the backing plate at least one groove open to the back side of the backing plate runs between a coolant inlet and a coolant outlet, that the groove is enclosed by an outer frame of the backing plate, and within the frame at least one ridge, which runs at a distance from the frame, separates two grooved sections from one another, and that the open side of the groove is closed off by a sealing plate welded to the frame and the ridge to form a cooling channel having a closed cross section.

The essential feature of the invention, therefore, is that the coolant channels are provided in the backing plate which simultaneously is used as a cooling plate, thereby realizing a small thickness overall because a two-part design, as described above for the prior art, may be omitted. The required rigidity of the backing plate is achieved by the fact that a relatively flat sealing plate which closes off the channels is attached to the frame of the backing plate not only at its edge, but also along its entire surface to one or more ridges that separate the various sections of the groove from one another. In addition to the edge attachment a plurality of attachment lines distributed over the backing plate is also provided, resulting in all-around reinforcement of the backing plate.

Since the weld seam on the ridges is covered by the sealing plate itself, a welding technique must be used in which covered weld seams may be placed. Electron beam (EB) welding has proven satisfactory for this task.

To obtain a smooth back side of the backing plate, the inner edge of the frame has a shoulder around its circumference for accommodating the sealing plate. The height of the shoulder corresponds to the thickness of the sealing plate, so that the sealing plate resting on the shoulder is flush with the part of the frame that is not offset, thereby achieving overall a smooth back surface.

For supplying the cooling channels with a cooling liquid, at least two pockets open to the back side are provided in the frame which are covered by the sealing plate. In the region of the sealing plate which lies above the pockets, holes are provided which are used for supplying and discharging a coolant. To this end, the backing plate is placed on the above-mentioned supporting plate in such a way that the holes align with corresponding coolant boreholes in the supporting plate.

As likewise previously mentioned, the backing plate should not lie flat on the supporting plate, but instead should lie on support ridges present thereon. The pockets are thus located in the part of the frame that is not offset, for which purpose the sealing plate has lugs which lie above the pockets and in which the holes for supplying and discharging a coolant are present.

As mentioned above, the backing plate is used for attaching tiles made of material to be sputtered in a sputtering unit. The magnets mounted behind the backing plate or supporting plate create an erosion zone in the form of oval rings, also referred to as "racetracks." An increased sputtering rate is generally present in the circular sections of an oval, so that thicker end tiles are preferably installed here. In order to nevertheless achieve a flat upper plane of the tiles, it is necessary to recess the end tiles on the backing plate. To this end, the front side of the backing plate has a recessed section on an end region that extends along the entire width of the backing plate. End tiles may be used here which have surfaces that are flush with the remaining tiles.

Since the tiles do not cover the backing plate over its entire width, the edge of the backing plate remains free and forms a frame for the tiles. To have a continuously flat surface in the edge region as well, a U-shaped filler sheet having a thickness corresponding to the depth of the recess is placed on the edge of the recessed region.

As mentioned above, multiple backing plates of the aforementioned type, each provided with tiles, are fastened next to one another on a supporting plate to obtain a larger sputtering target having a correspondingly extended cooling surface. Since each individual backing plate forming a section of the sputtering target has its own cooling circuit, effective cooling can be achieved. To simplify installation, the end faces of the mutually abutting backing plates are provided with corresponding shoulders. Each of the tiles is flush with the end face of the backing plate on which they fastened, so that the butt edges of the tiles are flush with one another on two adjacently mounted backing plates.

Since the sputtering target is divided into a plurality of sections, the individual sections, each comprising a backing plate and the tiles fastened thereon, are relatively easy to separate from one another and handle, thereby simplifying maintenance and repair activities as well as replacement of used tiles. The easy divisibility is achieved in particular by the fact that each backing plate has its own cooling circuit, and therefore the cooling channels in the backing plate do not communicate with one another, at least not inside the chamber. This has the additional advantage that there is no need to connect the cooling channels on the backing plate with one another. During sputtering, such connections can be kept sealed only with great effort under the given operating conditions in a chamber. As a result of the modular design, large sputtering targets may be achieved that are economical to operate.

As previously mentioned, the backing plates that have previously been provided on their front side with the tiles are fastened en masse to the interior of a supporting plate, which is inserted as a whole into the opening of a vacuum chamber, so that the backing plate is situated inside the chamber. The backing plate thus lies on support ridges of the supporting plate, the coolant inlets and outlets resting on these support ridges. To feed coolant to the backing plate, coolant boreholes lead through the support ridges from the exterior to the interior of the supporting plate, and align with the holes in the sealing plate. To seal this connection a sealing system is provided, which according to the invention comprises two sealing rings radially separated at a distance from one another, the interspace between the sealing rings being connected via a ventilation borehole to the outside of the supporting plate, and thus to the atmosphere. The interior sealing ring thus insulates the supply or discharge of the coolant with respect to the atmosphere, and creates a separation between the atmosphere and the vacuum inside the chamber. Thus, coolant liquid that breaks through the first sealing ring does not immediately enter the vacuum, but instead passes into a ventilated region where it can evaporate, which reduces the load on the vacuum from foreign materials so that the pump performance is not overburdened.

The sealing rings are preferably situated in the supporting plate, although the same objective would also be achieved if they were located in the backing plate. However, this would have the disadvantage that the sealing rings could be damaged by the heat produced during soldering of the tiles on the front side of the backing plate.

The inventive concept is illustrated below with reference to an exemplary embodiment, and is explained in greater detail in several figures, as follows:

DESCRIPTION OF THE DRAWINGS

FIG. 1 shows a sputtering target 1 comprising a plurality of adjacently placed backing plates 2, 3, 4. The backing plates 2, 3, 4 each have a rectangular shape and abut against one another at their short end faces, so that two outer backing plates 2, 4 are situated at the ends of the sputtering target 1 and a center backing plate 3 is situated in the middle. The sputtering target 1 may be lengthened as desired by placing additional backing plates, corresponding to the center backing plate 3, between the two outer backing plates 2, 4. Basically, the backing plates may also be wider than illustrated here, whereby the mutually abutting end faces are formed from the then long sides of the backing plates.

FIG. 1 shows the view from below, and thus of the back side of the backing plates 2, 3, 4. A meandering groove 5 is milled into the back side of each backing plate, so that the groove 5 is enclosed all around by a frame 6. To separate the individual sections of the meandering groove 5 from one another, ridges 7 are provided which extend in an alternating manner from one end face to the other over the length of the backing plate. The inside of the frame is provided with a shoulder 8 that runs at the same height as the upper edge of the ridges 7. To close off the groove 5 and thus form a cooling channel a sealing plate 9 may be inserted in the frame, the thickness of the sealing plate 9 corresponding to the height of the shoulder 8 and resulting in a flush connection to the frame 6.

Figure 1:
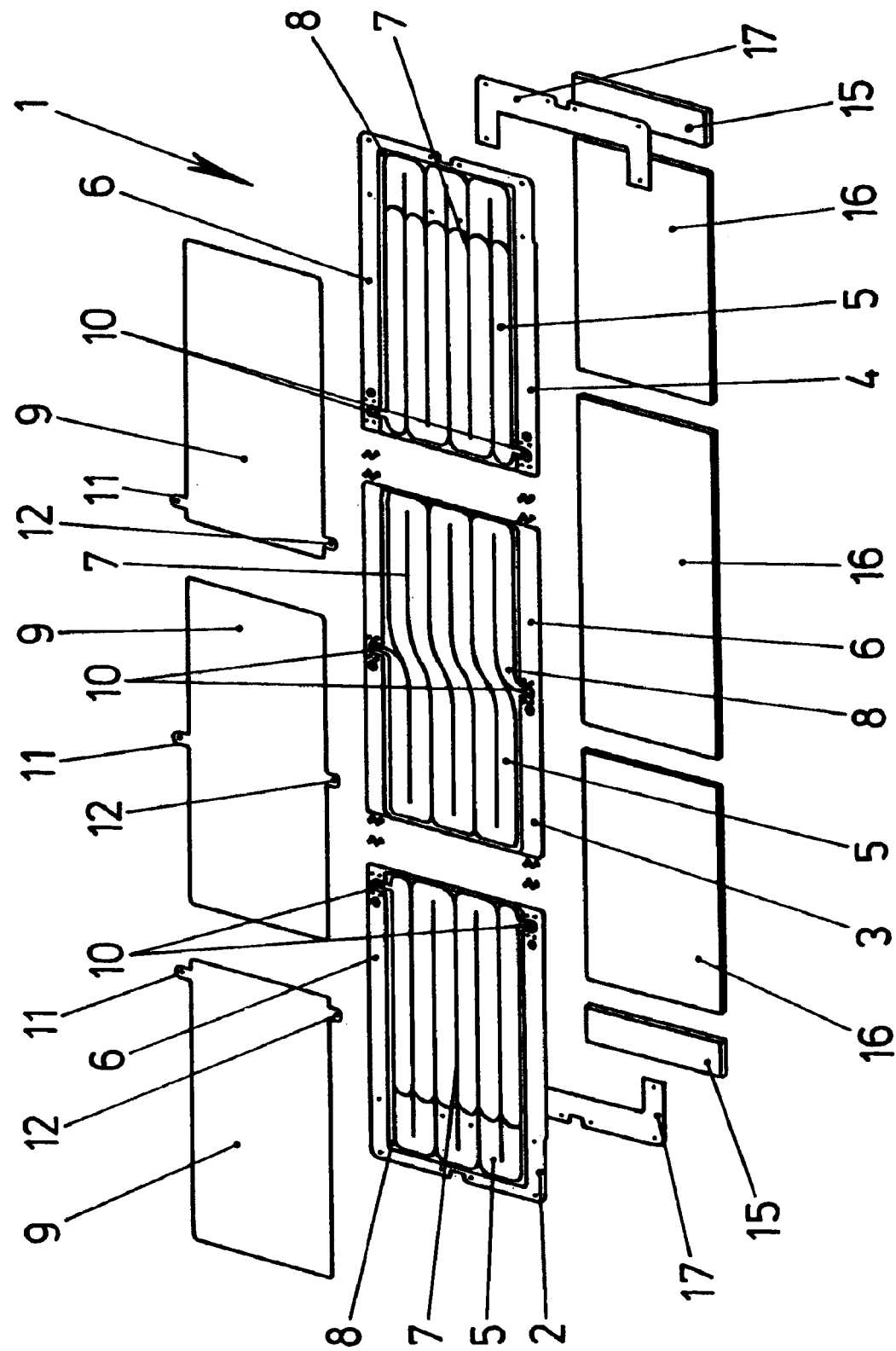
FIG. 1 shows a perspective exploded illustration of a set of multiple backing plates, with a view of the back side of the backing plates.

To feed and discharge the cooling water, a pocket 10 opening into the groove 5 is situated in each of the oppositely located longitudinal sections of the frame 6, the pockets being covered by laterally projected lugs 11 on the sealing plate 9, whereby a hole 12 is present in each of the lugs 11 which lies above the pocket 10.

Tiles 15, 16, which are made of the material to be sputtered, are soldered onto the front side of the backing plates 2, 3, 4, not visible here. When these tiles are used up, the residues may be detached and replaced by new tiles 15, 16.

Figure 2:
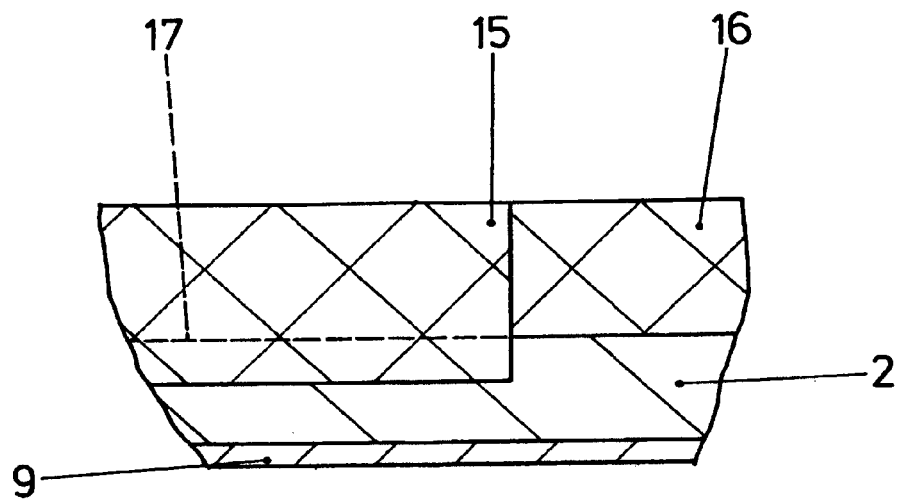
FIG. 2 shows a cross section through a backing plate in its end region.
Figure 4:
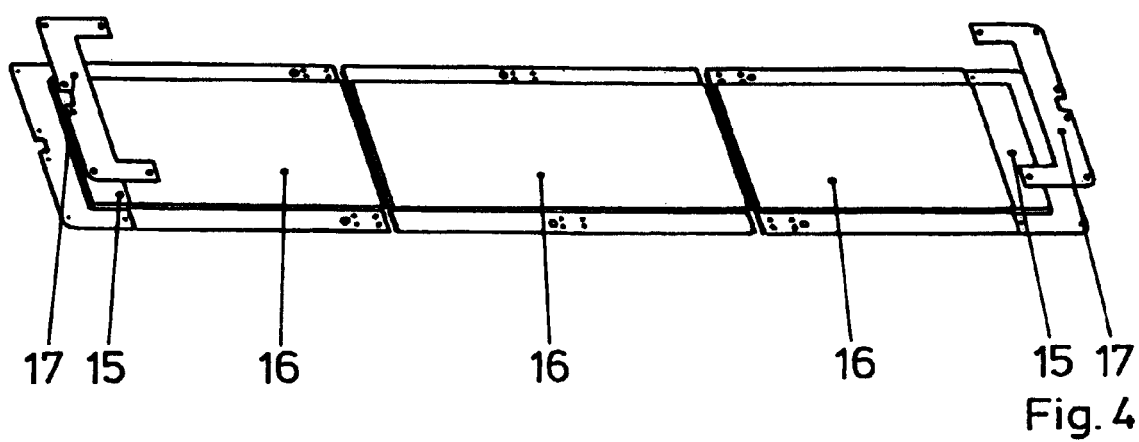
FIG. 4 shows a perspective exploded illustration of a set of multiple backing plates, with a view of the front side of the backing plates.

As shown in FIG. 4, the tiles 15, 16 for the center backing plate 3 extend over the entire length thereof, but their width leaves the edge free. The exterior ends of the outer backing plates 2, 4, which may also be seen in the cross section in FIG. 2, are offset downward in a stepped manner so that thicker tiles 15 may be placed there which are flush with the adjoining flatter tile 16. To achieve this, on the back side of the outer backing plates 2, 4 a flat offset is made in its end section over the entire width. The use of the entire width simplifies soldering the thicker tiles 15, since at that location the lower edge of the tiles is free. To obtain a flush connection of the edge that remains free to the other edge region after the tiles 15, 16 are fastened, a U-shaped filler sheet 17 is attached to the front side of the backing plates 2, 3, 4 which encloses the thicker tile 15 on three sides. The position of the filler sheet 17 is indicated by a dashed line in FIG. 2.

Figure 3:
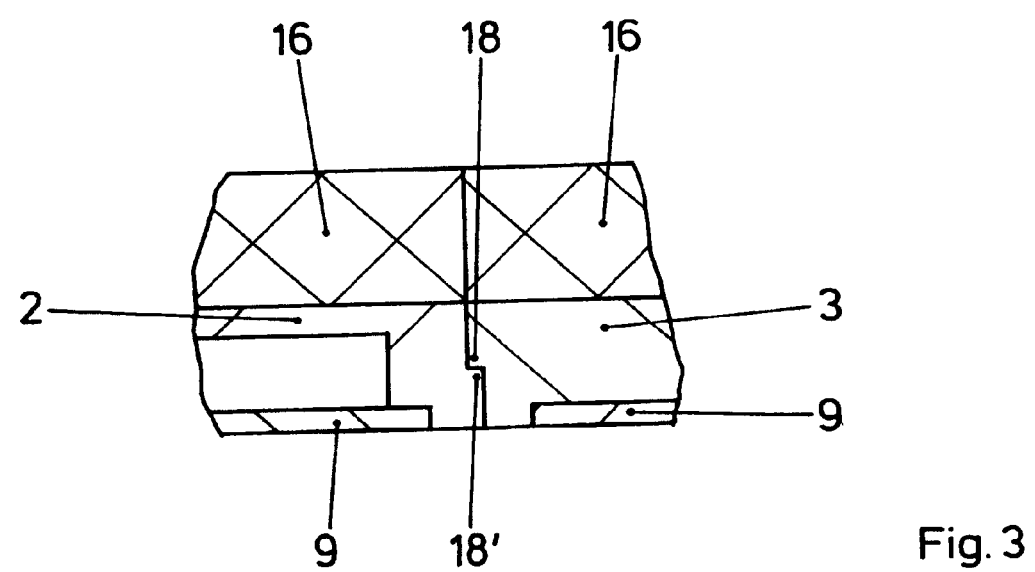
FIG. 3 shows a cross section through two backing plates at their abutting end faces.

FIG. 3 shows the transition between two backing plates, for example an outer backing plate 2 and the center backing plate 3. To simplify the installation here, each end face is provided with corresponding shoulders 18, 18', a projection on the one plate 2 engaging in a depression in the other backing plate 4 [sic].

The inserted sealing plates 9 are also welded around the circumference to the shoulder 8 of the edge 6, using an electron beam welding technique, so that the groove region is closed off all around, which initially would be sufficient to form a closed cooling channel region. Additional welds are made to one or more ridges 7. These welds serve in particular to reinforce the unit, so that in spite of the relatively thin backing plate 2, 3, 4 a high torsional rigidity of the backing plate 2, 3, 4 is achieved. The weld may be made to all of the ridges 7, or also only to one of the center ridges 7.

Figure 5:
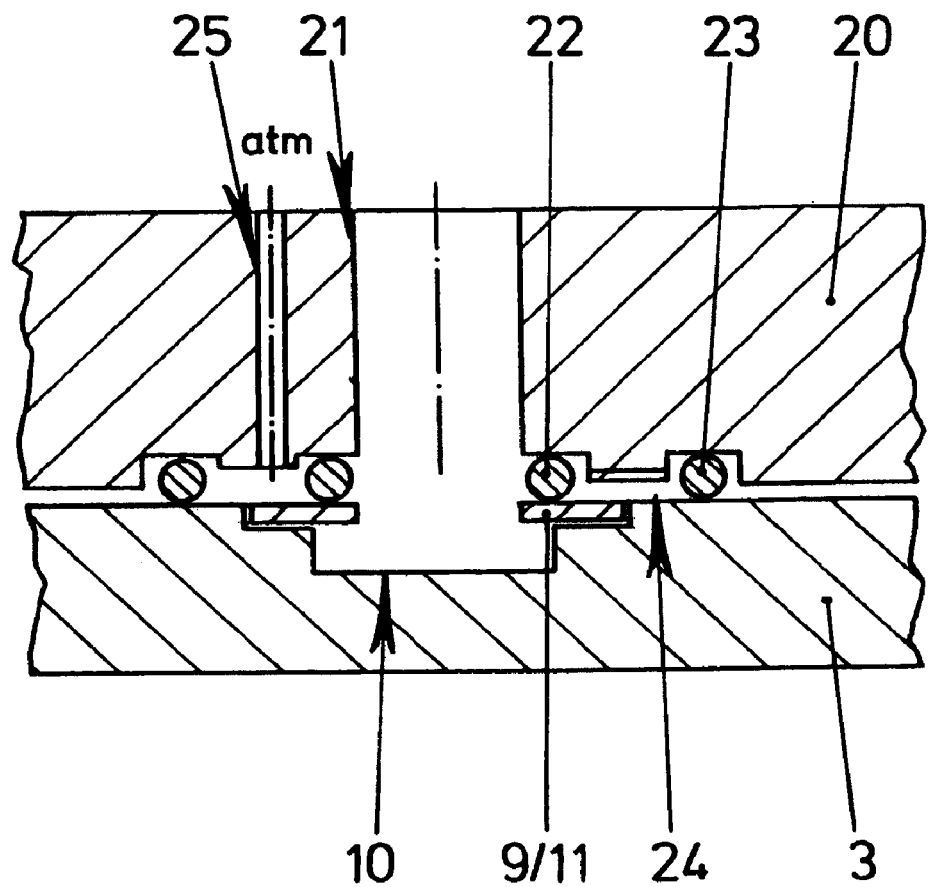
FIG. 5 shows a cross section through a coolant connection.

FIG. 5 shows the connection of such a backing plate to a supporting plate 20 that is provided with cooling water boreholes 21, one of which is illustrated. This borehole aligns with one of the holes 12 in one of the sealing plates 9. To seal the connection a double sealing system is provided which comprises a first, interior sealing ring 22 and a second, radially outwardly situated sealing ring 23. Between these sealing rings an annular space 24 is provided which is connected via a ventilation borehole 25 to the outside of the supporting plate 20, and which thus connects the annular space 24 to the atmosphere. The sealing rings 22, 23 lie in grooves in the interior of the supporting plate 20; the annular space 24 is provided there as well. The inner sealing ring seals off the coolant liquid with respect to the atmosphere, and the outer sealing ring 23 seals off the annular space, and thus the atmosphere, with respect to the vacuum present inside the supporting plate 20 in the chamber.

LIST OF REFERENCE NUMBERS

1 Sputtering target
2 Outer backing plate
3 Center backing plate
4 Outer backing plate
5 Groove
6 Frame
7 Ridge
8 Shoulder
9 Sealing plate
10 Pocket
11 Lug
12 Hole
15 Thicker tile
16 Thinner tile
17 Filler sheet
18, 18' Shoulder
20 Supporting plate
21 Coolant borehole
22 Sealing ring
23 Sealing ring
24 Annular space
25 Ventilation borehole

The invention claimed is:

1. A sputtering target comprising:
a backing plate comprising at least one coolant inlet and at least one coolant outlet;
a supporting plate positioned substantially abutting the backing plate forming a transition area therebetween the supporting plate and the backing plate, wherein the supporting plate defines a plurality of boreholes, whereby at least one borehole substantially aligns with a respective at least one coolant inlet and at least one borehole substantially aligns with a respective at least one coolant outlet;
a plurality of first sealing rings therebetween the backing plate and the supporting plate, substantially coaxial with and surrounding each of the at least one coolant inlets and at least one coolant outlets, substantially sealing the boreholes from the transition area; and
a plurality of second sealing rings therebetween the backing plate and the supporting plate, each second sealing ring being substantially coaxial with, substantially surrounding, and spaced therefrom each of the first sealing rings, thereby forming an annular space between each of the first sealing rings and each of the second sealing rings,
wherein the supporting plate further defines a ventilation borehole substantially therethrough the supporting plate, wherein the annular space is in communication with the atmosphere via the ventilation borehole.

* * * * *